United States Patent [19]
Kozel

[11] Patent Number: 5,731,958
[45] Date of Patent: Mar. 24, 1998

[54] GRAVITY LATCH FOR SURFACE MOUNT COMPONENTS

[75] Inventor: Charles A. Kozel, McHenry, Ill.

[73] Assignee: Methode Electronics, Inc., Chicago, Ill.

[21] Appl. No.: 634,112

[22] Filed: Apr. 17, 1996

Related U.S. Application Data

[63] Continuation of Ser. No. 301,022, Sep. 6, 1994, abandoned.

[51] Int. Cl.⁶ .................................................. H05K 1/14
[52] U.S. Cl. ........................ 361/743; 361/760; 361/825; 174/260; 439/83
[58] Field of Search ........................... 361/760–764, 361/785, 791, 825, 743; 228/179.1, 180.1, 180.21; 439/55, 83; 174/260–261

[56] References Cited

U.S. PATENT DOCUMENTS

| | | |
|---|---|---|
| 4,826,442 | 5/1989 | Douty et al. ........................ 439/92 |
| 4,967,262 | 10/1990 | Farnsworth. |
| 5,281,152 | 1/1994 | Takahashi et al. ..................... 439/79 |
| 5,352,851 | 10/1994 | Wallace et al. ...................... 174/52.4 |
| 5,586,008 | 12/1996 | Kozel et al. ......................... 361/743 |

*Primary Examiner*—Bot L. Ledynh
*Attorney, Agent, or Firm*—David L. Newman

[57] ABSTRACT

A latch connected to a surface mount component for subsequent connection to a printed circuit board is provided as well as a method for mounting a surface mount component to a printed circuit board. The surface mount component has a soldering tail extending therefrom and at least one latch insertable through an aperture in the printed circuit board, without force, such that the soldering tails extending from the surface mount component rest on corresponding soldering pads of the printed circuit board. As a result, surface mount components are mountable to a printed circuit board using standard, available equipment, such as a vacuum head placed component, and the components are subsequently soldered to the printed circuit board.

18 Claims, 4 Drawing Sheets

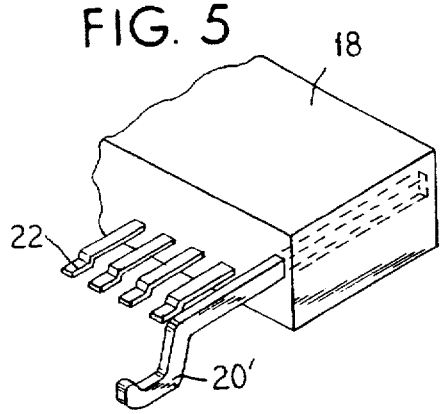
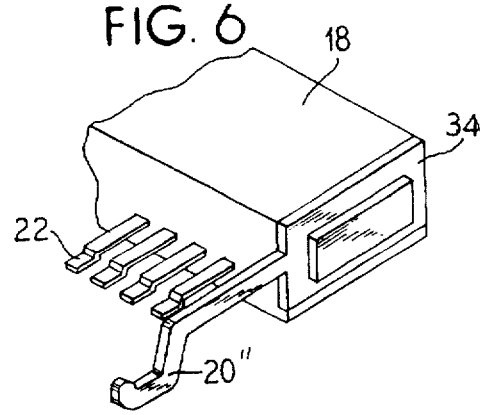
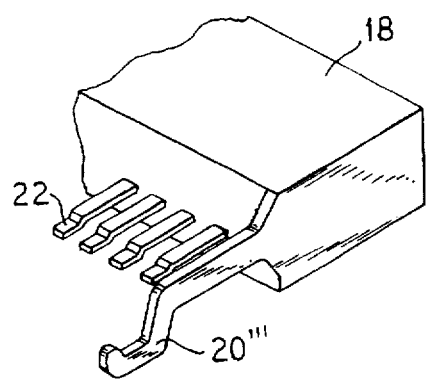
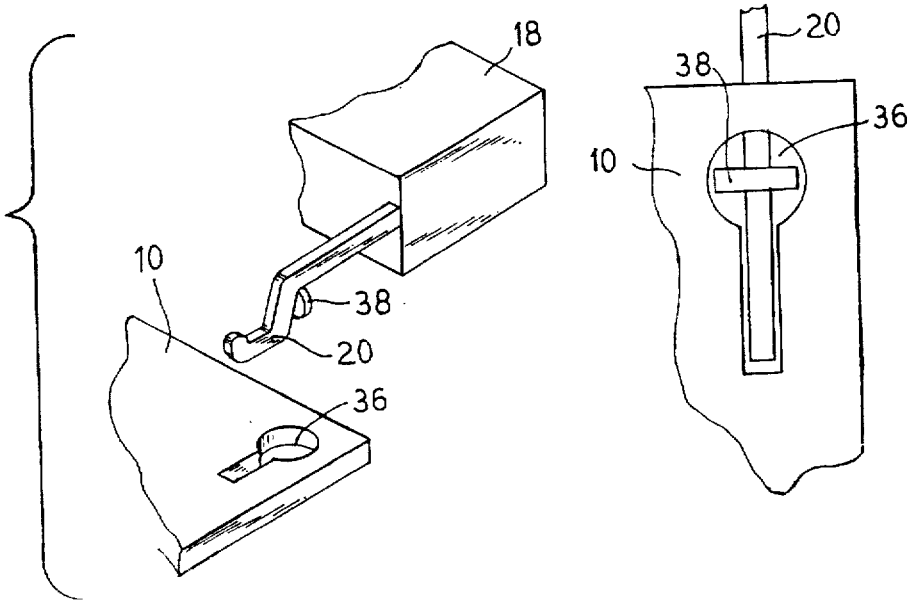

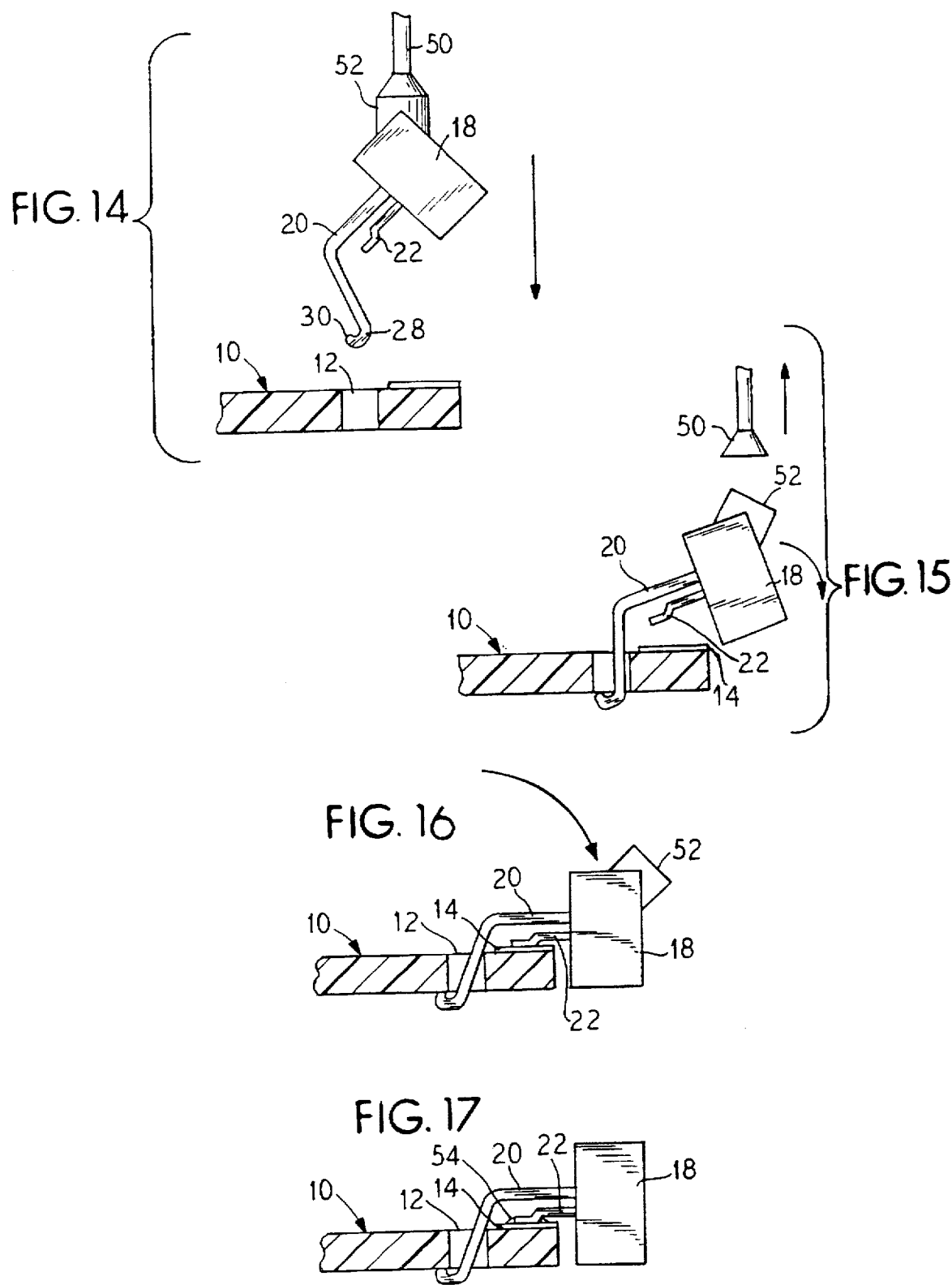

GRAVITY LATCH FOR SURFACE MOUNT COMPONENTS

This application is a continuation of U.S. Ser. No. 08/301,022 filed Sep. 6, 1994, now abandoned, and is related to U.S. Pat. No. 5,586,008.

BACKGROUND OF THE INVENTION

The present invention generally relates to an apparatus and a method for attaching one or more components to another component. More specifically, the present invention relates to a latch for connecting a surface mount component to a printed circuit board prior to soldering of the component to form an assembly.

It is, of course, generally known to add components to a printed circuit board. Many components, however, are mounted at or near an edge of the printed circuit board or even off of the edge of the printed circuit board.

To mount such components, solder screening of the printed circuit board is first conducted followed by placement of the components on or near the printed circuit board. Then, fellow soldering of the assembled component to the circuit board is required to complete the process for assembly of surface mount components to the printed circuit board.

Many components, however, such as connectors, are unstable prior to the reflow soldering process. As previously mentioned, some components are mounted toward the edge or off of the edge of the printed circuit board. Therefore, prior to the reflow soldering process, these components must be mechanically held in place.

A couple of variations have been proposed to mechanically hold the components prior to the reflow soldering process. One such proposal is extension of rails of the printed circuit board itself. That is, two opposite sides of the printed circuit board are extended to form strips beyond an end of the printed circuit board. At that end, the surface mount components require attachment to the printed circuit board and may be balanced between the extended sides or rails of the printed circuit board thereby mechanically holding the components prior to reflow soldering of the same.

Alternatively, another known method for mechanically holding a surface mount component prior to the reflow soldering process is to provide a mechanical-type support attached as an extension of the surface mount component. The support or extension requires a press fit into an aperture formed in the printed circuit board.

Each of these known methods, however, have drawbacks. The extended support rails from the printed circuit board are generally fragile. Furthermore, the support rails do not force the surface mount component tail into the soldering pad as is necessary for securing the surface mount components to the printed circuit board.

Likewise, the mechanical press-in support requires a force in the Z-direction (or Z-force), i.e., a force perpendicular to a plane of the printed circuit board to seat the surface mount components in the printed circuit board. A standard assembly mechanism uses a vacuum to pick the surface mount components and place the surface mount components in the assembly as required. However, a Z-force is not available for such a typically available pick and place vacuum assembly for mounting surface mount components to printed circuit boards.

A need, therefore, exists for an improved latch for surface mounting components to a printed circuit board that both locates and holds down the surface mount components during a pick and place assembly operation and further provides location and stability throughout the assembly including during the reflow soldering process.

SUMMARY OF THE INVENTION

The present invention provides a latch, a method for surface mounting a component, and a combined assembly of a printed circuit board and attached surface mount components. The latch of the present invention extends through an aperture in a printed circuit board such that soldering tails extending from a component for surface mounting from which the latch extends rest on the circuit board in an orientation for soldering of the tails to the circuit board.

To this end, in an embodiment, the present invention provides a latch extending from a component having a plurality of soldering tails extending substantially equidistantly from an end of the component at points substantially equidistantly from a base of the component wherein the component requires mounting to a printed circuit board. The latch has a first member having a first end connected to the component in a direction substantially perpendicular to the length of the component. The first end is connected to the component. A second end of the latch extends beyond the distance of the plurality of soldering tails wherein the rigid member is constructed and arranged such that the second end terminates at a point at or below the point at which the soldering tails are arranged above the base.

In an embodiment, the rigid member of the latch of the present invention extends from the component for a length at least equal to the length of the soldering tails.

In an embodiment, the rigid member of the latch of the present invention has a hook formation at the second end.

In an embodiment, the latch further comprises a soldering tab intermediately located between the first end and the second end.

In an embodiment, the rigid member of the latch of the present invention is molded as a part of the component.

In an embodiment, the rigid member of the latch of the present invention is die-stamped and attached to an end of the component.

In an embodiment, the rigid member of the latch of the present invention is a wire pin extending from the end of the component from which the plurality of soldering tails extend.

In another embodiment of the present invention, a method is provided for surface mounting a component to a printed circuit board requiring soldering of a plurality of soldering tails extending substantially equidistantly from the components to secure the components to the printed circuit board. The method comprises the steps of: providing an aperture in the printed circuit board; providing a member extending from the component a distance from the component greater than the distance of the plurality of soldering tails; and placing the member through the aperture, without force, to connect the component to the printed circuit board wherein the placement effects placement of the soldering tails.

In an embodiment, the method further comprises the step of soldering the plurality of soldering tails to the printed circuit board.

In an embodiment, the method further comprises the step of die-stamping the member attached to the component.

In an embodiment, the method further comprises the step of molding the member as a part of the component.

In an embodiment, the method further comprises the step of using a vacuum head to hold the component and to place the member through the aperture.

In another embodiment of the present invention, a combined assembly of a printed circuit board and an attached surface mount component is provided. The combined assembly has a plurality of soldering tails extending from the component and a first support latch extending substantially parallel from the component. An aperture through the printed circuit board receives the first support latch therethrough wherein the plurality of soldering tails rests on a face of the printed circuit board through which the first support latch extends. The first support latch has a cross-sectional area smaller than the aperture thereby receiving the first support latch without force.

In an embodiment, the combined assembly has a plurality of soldering paths on the face of the printed circuit board corresponding to the plurality of soldering tails. Each of the plurality of soldering tails rests on a corresponding one of the plurality of soldering pads.

In an embodiment, the combined assembly further comprises a second or more support latches remotely attached to the component at a distance from the first support latch. The second support latch is substantially identical to the first support latch.

It is, therefore, an advantage of the present invention to provide a latch for surface mounting components to a printed circuit board.

Another advantage of the present invention is to provide a latch, a method for surface mounting and a combined assembly that allows surface mounting of components to a printed circuit board without downward force applied to the component.

Yet another advantage of the present invention is to provide a latch constructed and arranged such that soldering tails extending from a surface mount component rest in soldering pads of a printed circuit board.

A still further advantage of the present invention is to provide a latch, a method for surface mounting components and a combined assembly of a printed circuit board and a surface mount component which is capable of mounting components at an edge of the printed circuit board, off an edge of a printed circuit or mid-board on the printed circuit board.

And, another advantage of the present invention is to provide a latch for mechanically holding a surface mount component without additional extensions from a printed circuit board.

Moreover, an advantage to the present invention is to provide a latch attached to a surface mount component allowing the use of a standard vacuum head for placement of the surface mount components at or adjacent the printed circuit board.

A still further advantage is to provide a latch, a method for surface mounting components to a printed circuit board and a combined assembly of a printed circuit board and a surface mount component that is inexpensive to implement.

These and other advantages of the present invention will be described in and will be apparent from the detailed description of the presently preferred embodiments and from the drawings.

BRIEF DESCRIPTION OF THE DRAWINGS

FIG. 5 illustrates an embodiment of a latch of the present invention secured to a surface mount component.

FIG. 6 illustrates an alternative embodiment of a latch of the present invention secured to a surface mount component.

FIG. 7 illustrates another alternative embodiment of a latch of the present invention connected to a surface mount component.

FIG. 8 illustrates an exploded perspective view of an alternative embodiment of a latch connected to a surface mount component and a corresponding aperture in a printed circuit board through which the surface mount component extends.

FIG. 9 illustrates a bottom plan view of the embodiment of the latch illustrated in FIG. 8 in the aperture of the printed circuit board illustrated in FIG. 8.

FIG. 14 illustrates a first step of a method for picking a surface mount component for mounting onto a printed circuit board using an embodiment of the latch of the present invention.

FIG. 15 illustrates a second step of placing a surface mount component with the embodiment of the latch component illustrated in FIG. 14.

FIG. 16 illustrates a third step of a method of attaching a solder mount component to a printed circuit board with the embodiment of the latch illustrated in FIGS. 14 and 15.

FIG. 17 illustrates a final assembly of a component secured to a surface having the embodiment of the latch illustrated in FIGS. 14, 15 and 16 of the present invention.

DETAILED DESCRIPTION OF THE PRESENTLY PREFERRED EMBODIMENTS

The present invention provides a latch, a method for surface mounting a component with the latch to a printed circuit board and a combined assembly of a printed circuit board and an attached surface mount component or components. The latch of the present invention extends from the surface mount component through an aperture formed through the printed circuit board such that soldering tails extending from the surface mount component are supported on soldering pads of the printed circuit boards for subsequent soldering thereon.

Figure 1:
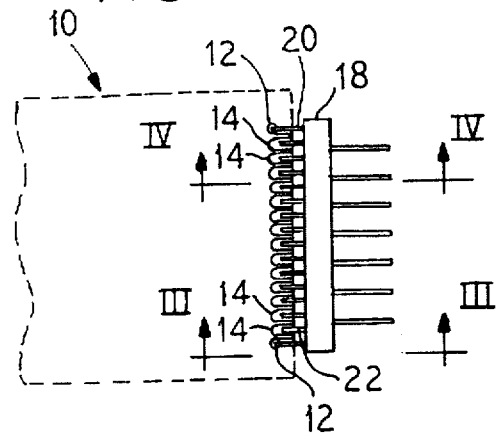
FIG. 1 illustrates a plan view of an embodiment of the present invention illustrating a surface mount component latched and soldered to a printed circuit board in accordance with the principles of the present invention.

Referring now to the drawings wherein like numerals refer to like parts, FIG. 1 illustrates a printed circuit board 10 having a pair of apertures 12 therethrough. Soldering pads 14 are provided on an upper surface 16 of the printed circuit board to provide connection, both mechanically and electrically, between the printed circuit board 10 and a surface mount component 18, such as a male header as illustrated in FIGS. 1–4 or a female connector as illustrated in FIGS. 5–8.

Figure 2:
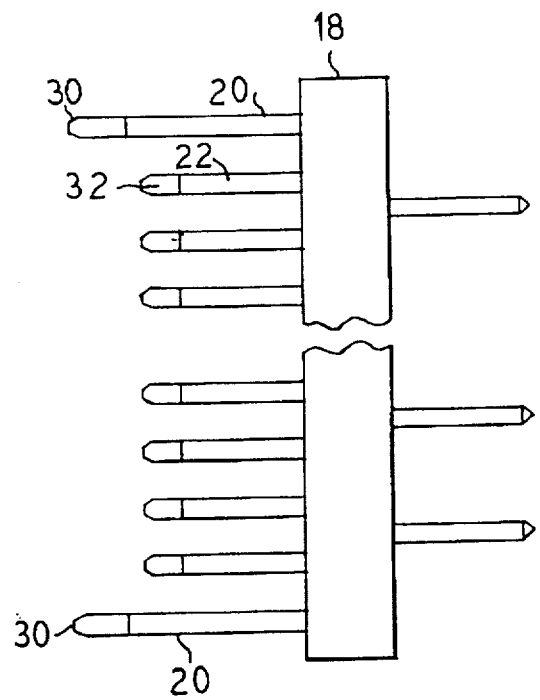
FIG. 2 illustrates an exploded plan view of an embodiment of latches and contacts for the present invention.
Figure 3:
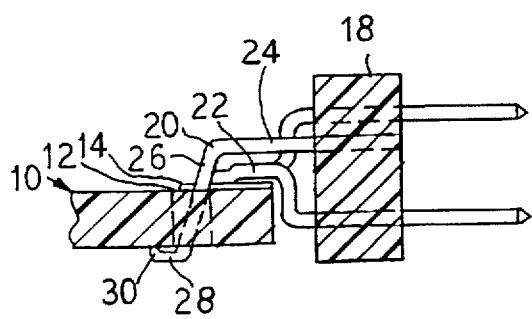
FIG. 3 illustrates a cross-sectional view taken generally along the line III—III of FIG. 1.
Figure 4:
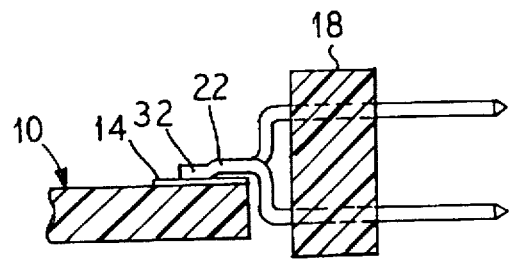
FIG. 4 illustrates a cross-sectional view taken generally along the line IV—IV of FIG. 1.

The surface mount component 18 as illustrated in FIGS. 2–4, includes at least one latch 20 extending therefrom in a direction substantially perpendicular to a length of the component 18. A pair of latches 20 is illustrated in FIG. 2 for subsequent insertion into the apertures 12 of the printed circuit board 10. The latches 20 extend a distance from the surface mount component 18 greater than a distance which a plurality of solder tails 22 extend from the surface mount component 18. The solder tails 22 also extend a distance substantially equidistantly from the surface mount component 18.

As illustrated in FIG. 3, the latch 20 is integrally formed of a first portion 24 that extends substantially perpendicularly from a length of the component 18. The latch 20 is then bent at an angle and continues for a second portion 26 that extends for a length before being bent at an angle such that a short third portion 28 is provided substantially parallel to the first portion 24. Finally, the latch 20 forms a lip 30 at a tip of the latch 20. Following the first portion 24 of the latch 20, the remainder of the latch 20 including the second portion 26, the third portion 28 and the lip 30 is insertable through the aperture 12 formed through the printed circuit board 10.

The surface mount component 18 is then suspendable from the printed circuit board 10 for subsequent soldering of the solder tails 22 to the solder pads 14 of the printed circuit board 10. In the position illustrated in FIGS. 1 and 4, the solder tails 22 extend such that a slightly detented end portion 32 of the solder tails 22 rest on the soldering pads 14 of the printed circuit board 10 as illustrated in FIG. 4.

Referring now to FIGS. 5, 6 and 7, alternate embodiments for attaching a latch to the surface mount component 18 are illustrated. In the embodiment illustrated in FIG. 5, the latch 20' is in the form of a pin insertable into the body of the surface mount component 18 as shown in phantom. The latch 20' may be wire made of a metal, for example, inserted into the surface mount component 18. The wire latch 20' may be friction fit into the insulated section of the surface mount component 18 and/or may have a specially designed end having a barb or the like for retaining the wire latch 20' in the surface mount component 18.

In another embodiment, a latch 20" is illustrated in FIG. 6. The latch 20" is a die-stamped style latch attached to an end face of the surface mount component 18. An integrally formed frame 34 is press fit, in an embodiment, over a specially designed end of the surface mount component 18 for receiving the frame 34. The frame 34 may also be adhesively attached, welded or otherwise secured at the end of the surface mount component 18.

FIG. 7 illustrates another embodiment of a latch 20''' molded as a part of the surface mount component 18. The latch 20''' is, therefore, the same material as the casing of the surface mount component 18, preferably plastic. Since molded plastic is used for the latch 20''' integrally formed with the surface mount component 18, the latch 20''' is constructed substantially larger than the metal wire embodiments of the latch illustrated in FIGS. 5 and 6. Each of the embodiments illustrated in FIGS. 5, 6 and 7 also shows a plurality of solder tails 22 for subsequent soldering to a soldering pad 14 of a printed circuit board 10.

Referring now to FIGS. 8 and 9, a latch 20 is illustrated. The latch 20 may be any type of latch as shown in FIGS. 5, 6 or 7, but, for the sake of simplicity, an integrally molded latch with the surface mount component 18 is shown. The latch 20 illustrated is particularly designed to provide a locator feature used in conjunction with a specially designed key-hole aperture 36 in the printed circuit board 10.

To this end, a locator 38 is provided attached to or integrally formed with the latch 20 such that insertion into the key-hole aperture 36 of the printed circuit board 10 is only provided as a result of alignment of the locator 38 with the widest portion of the key-hole aperture 36. This allows the latch 20 to be moved along the edge of the printed circuit board 10 until the locator 38 matches with the widest portion of the key-hole aperture 36 allowing insertion of the latch 20 therein.

Figure 10:
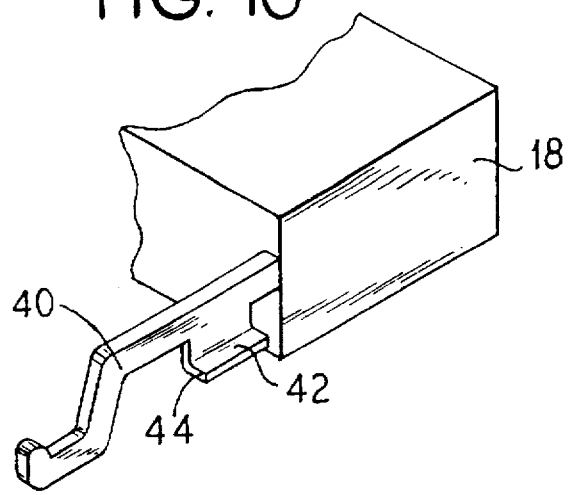
FIG. 10 illustrates a perspective view of another alternate embodiment with a solder tail connected to a latch of the present invention.
Figure 11:
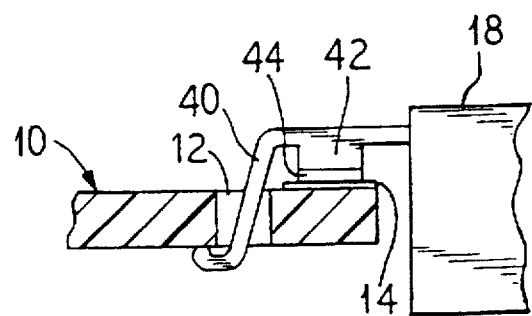
FIG. 11 illustrates a cross-sectional view of a latch of FIG. 10 of the present invention with an added solder pad on the latch for connection to a printed circuit board.

FIGS. 10 and 11 illustrate alternate embodiments of a latch 40 of the present invention including an integral solder tab 42. The solder tab 42 is integrally formed with the latch 40 such that following placement of the latch 40 as illustrated in FIG. 11, the solder tab 42 may be separately soldered to the printed circuit board 10 providing additional mechanical strength for securing the latch 40 and hence the surface mount component 18. The integral solder tab 42 may be integrally formed with the latch 40, in a preferred embodiment, or separately attached, in another embodiment, to the latch 40 by a conventional means, such as welding, adhesively applied or the like. A lip 44 is formed on the solder tab 42 such that the solder tab lays substantially flat on top of the printed circuit board 10.

Figure 12:
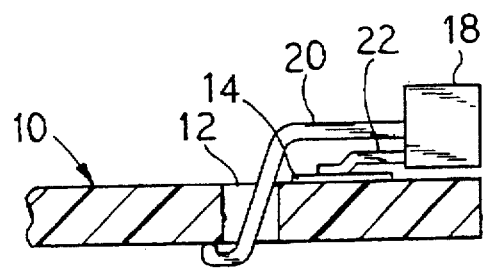
FIG. 12 illustrates a cross-sectional view of a surface mount component mounted on an edge of a printed circuit board with an embodiment of the latch of the present invention and solder tails.
Figure 13:
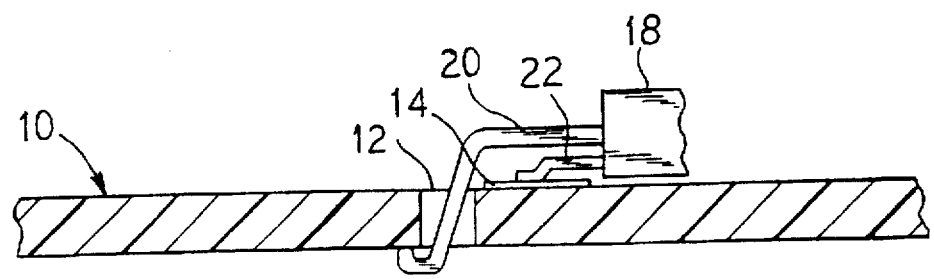
FIG. 13 illustrates a cross-sectional view of a surface mount component mounted midway on a printed circuit board using an embodiment of a latch of the present invention and a solder tail.

Referring now to FIGS. 12 and 13, two different arrangements from the arrangement illustrated in FIG. 1 with the surface mount component extending off the length of the printed circuit board are illustrated. In FIG. 12, the printed circuit board 10 extends such that its end extends substantially the same distance as the surface mount component 18 such that the ends of each, the printed circuit board 10 and the surface mount component 18, are substantially planar. Alternatively, FIG. 13 illustrates the surface mount component 18 at a point on the printed circuit board 10 such that the surface mount component 18 does not extend to its end (as in FIG. 13) or off the end of the printed circuit board 10 (as in FIGS. 1, 3 and 4).

FIGS. 14–17 illustrate a pick-and-place method implemented for a surface mount component 18 with an embodiment of a latch 20 of the present invention. As illustrated in FIG. 14, a vacuum head 50, as is generally known in the art, may be used to directly pick up the surface mount component 18 or indirectly pick up the surface mount component 18 via an angled feature or cap 52. The cap 52 may be integrally formed as a part of the surface mount component 18 or separately attached thereto.

The vacuum head 50, as illustrated in FIG. 14, positions at approximately a 45° angle, the surface mount component 18 above the aperture 12 of the printed circuit board 10 such that the third portion 28 and a lip 30 of the latch 20 may be inserted through the aperture 12 of the printed circuit board 10 without any forces applied thereto.

Following the lowering into the apertures 12, the vacuum head 50 is released as shown in FIG. 15. Upon release of the vacuum head 50, the surface mount component 18 as a result of gravitational forces begins rotating to its horizontal position as shown in FIG. 16 forcing the solder tail 22 to rest on the soldering pad 14 as illustrated in FIG. 16.

In this position, the latch 20 supports the surface mount component 18 from an underside of the printed circuit board 10. The force applied by the weight of the surface mount component 18 on the latch 20 on the underside of the printed circuit board 10 forces the solder tail 22 onto the soldering pad 14. The solder 54 as illustrated in FIG. 17 may then be reflowed around the solder tail 22 on the soldering pad 14 to secure the soldering tail 22, both mechanically and electrically, to the printed circuit board 10. Following the soldering operation, the cap 52 may be removed from the surface mount component 18.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

I claim:

1. A latch extending from a component having a plurality of soldering tails extending substantially equidistantly from an end of the component at points substantially equidistantly from a base of the component wherein the component requires mounting to a printed circuit board, the latch comprising:

a rigid member having a first portion connected to the component in a direction substantially perpendicular to the length of the component, the first portion connected to the component and a second portion extending beyond the distance of the plurality of soldering tails wherein the rigid member is constructed and arranged such that the second portion is angled from the first portion and protrudes through an aperture in the printed circuit board and a third portion extends parallel to the first portion and terminates at a point at or below the points at which the soldering tails are arranged above the base.

2. The latch of claim 1 wherein the rigid member extends from the component for a length at least equal to the length of the soldering tails.

3. The latch of claim 1 wherein the rigid member has a hook formation at the second end.

4. The latch of claim 1 further comprising:

a soldering tab intermediately located between the first end and the second end.

5. The latch of claim 1 wherein the rigid member is molded as a part of the component.

6. The latch of claim 1 wherein the rigid member is die-stamped and attached to the component.

7. The latch of claim 1 wherein the rigid member is a wire pin extending from the end of the component from which the plurality of soldering tails extend.

8. The latch of claim 1 wherein the third portion is longer than the second portion.

9. A combined assembly of a printed circuit board and an attached surface mount component, the combined assembly comprising:

a plurality of soldering tails extending from the component;

a first support latch having a first portion extending in a direction substantially perpendicular to the length of the component and a second portion angled from the first portion and a third portion extends parallel to the first portion; and an aperture through the printed circuit board receiving the second portion of the support latch therethrough wherein the plurality of soldering tails rests on a face of the printed circuit board through which the first support latch extends, the first support latch having a cross-sectional area smaller than the aperture thereby receiving the first support latch without force.

10. The combined assembly of claim 9 further comprising:

a plurality of soldering pads on the face of the printed circuit board corresponding to the plurality of soldering tails, each of the plurality of soldering tails resting on a corresponding one of the plurality of soldering pads.

11. The combined assembly of claim 9 wherein the first support latch is die-stamped and attached to an end of the component.

12. The combined assembly of claim 9 wherein the first support latch is a wire extending from the component a distance from the component greater than the plurality of soldering tails.

13. The combined assembly of claim 9 further comprising:

a second support latch remotely attached to the component at a distance from the first support latch, the second support latch substantially identical to the first support latch.

14. The combined assembly of claim 9 wherein the aperture is key-hole shaped.

15. A latch extending from a component having a plurality of adjacent soldering tails extending from the component wherein the component requires mounting to a printed circuit board, the latch comprising:

a rigid member having a first end connected to the component and a second end engaging an aperture of the printed circuit board having a hook at the second end for insertion in the aperture wherein the component and the second end of the rigid member are oriented such that rotational inertia allows the component to free fall from a first angle such that the soldering tails will rest on the printed circuit board and the component and the soldering tails are parallel to the printed circuit board.

16. The latch of claim 15 wherein the first angle is between 50 and 15 degrees from the surface of the printed circuit board.

17. The latch of claim 15 wherein the free fall of the component aligns the plurality of soldering tails to corresponding solder pads of a printed circuit board.

18. The latch of claim 15 wherein the second end of the rigid member extends beyond the distance of the plurality of soldering tails and below the points at which the soldering tails rest on the printed circuit board.

* * * * *